United States Patent [19]

Lepselter et al.

[11] 3,713,922

[45] Jan. 30, 1973

[54] HIGH RESOLUTION SHADOW MASKS AND THEIR PREPARATION

[75] Inventors: Martin Paul Lepselter, Bethlehem, Pa.; Alfred Urquhart MacRae, Berkeley Heights, N.J.

[73] Assignee: Bell Telephone Laboratories Incorporated, Murray Hill, N.J.

[22] Filed: Dec. 28, 1970

[21] Appl. No.: 101,592

[52] U.S. Cl. .......................156/16, 156/17, 148/175, 96/36.2, 204/143, 317/235.46

[51] Int. Cl. .................................................C23f 1/02

[58] Field of Search.......204/143 R, 143 GE; 156/16, 156/17; 161/206; 29/579; 96/36.1, 36.2; 313/89.9; 317/235.46, 48.9, 46

[56] References Cited

UNITED STATES PATENTS

| | | | |
|---|---|---|---|
| 3,421,055 | 1/1969 | Bean et al. | 148/175 |
| 3,096,262 | 7/1963 | Shockley | 204/143 |
| 3,113,896 | 12/1963 | Mann | 29/579 |

FOREIGN PATENTS OR APPLICATIONS

| | | | |
|---|---|---|---|
| 6,703,014 | 8/1968 | Netherlands | 204/143 GE |
| 1,186,340 | 4/1970 | Great Britain | |

OTHER PUBLICATIONS

Kosaka et al., Patterns of Double Evaporated Films Koga Kuin Daigaku Kenkyu Hokaku 1966, (20) 53–65 cited as page 3699, Vol. 69 (Chemical Abstracts for 1968).

*Primary Examiner*—Robert F. Burnett
*Assistant Examiner*—R. J. Roche
*Attorney*—R. J. Guenther and Arthur J. Torsiglieri

[57] ABSTRACT

The specification describes a method for preparing a thin silicon high resolution shadow mask, the latter adapted especially for use in processing materials by ion implantation. The method makes use of the preferential etch technique for silicon in which, for example, *n*+ material can be electrolytically removed in preference to higher resistivity n-type silicon. A thin (e.g. $< 10\mu$) epitaxial layer of n-silicon is deposited on an n+ substrate. The open regions of the mask are then converted, through the thickness of the epitaxial layer, to *n*+ material. After exposure to the preferential electrolytic etch treatment, a thin silicon shadow mask is left. Also disclosed are ribbed structures for enhancing the physical durability of the mask and techniques using crystallographic etching for further improving resolution.

4 Claims, 10 Drawing Figures

INVENTORS M. P. LEPSELTER
A. U. MAC RAE
BY
ATTORNEY

HIGH RESOLUTION SHADOW MASKS AND THEIR PREPARATION

This invention relates to high resolution masks for use in semiconductor and related processing. It is particularly directed to the formation of self-supporting shadow masks that should find use in processes employing ion implantation.

Localized treatment of preselected areas of semiconductors is normally accomplished by forming a mask on the semiconductor surface and performing the desired treatment, e.g., etching, diffusion, ion implantation, etc. The use of shadow masks for this purpose has often been proposed, it being recognized that merely placing the mask on the surface being treated, as in contact photography, is inherently far simpler than forming a coating on the semiconductor and then removing the coating chemically, where necessary. However, the art has encountered considerable difficulty in producing shadow masks that are self-supporting, and give high resolution.

According to the invention, a technique is described that is reasonably simple and economical and results in very thin, high resolution, shadow masks. It relies on the use of silicon as the semiconductor and preferential chemical etches for creating the pattern and for thinning. Specifically, the technique utilizes the selective rapid etching of *n*+ or damaged silicon, which can be produced by ion implantation or radiation damage, respectively. The mask is fabricated from epitaxial silicon, of the order of a fraction to a few microns in thickness, of high resistivity (preferably greater than 1 ohm cm), which has been deposited on an *n*+ substrate. The desired pattern is formed in the mask layer with the aid of standard photoresist techniques. For example, a metal layer can be deposited on the epitaxial layer and the desired pattern formed by standard photolithography. The metal layer has a thickness sufficient to shield the covered portions of the epitaxial layer against an ion beam. The slice is then implanted with *n*+ impurities, for example phosphorus, at an energy sufficient to make the open regions in the metal layer n+ down to the *n*+ substrate material. At this point the metal layer can be removed or retained and the *n*+ material is etched away, using the preferential etch technique described in United States patent application Ser. No. 885,605, filed Dec. 16, 1969, by H. A. Waggener, or Dutch patent application 6,703,013, to form the ultrathin shadow mask.

The details of the invention will be described in connection with the drawing in which.

Figure 1A:
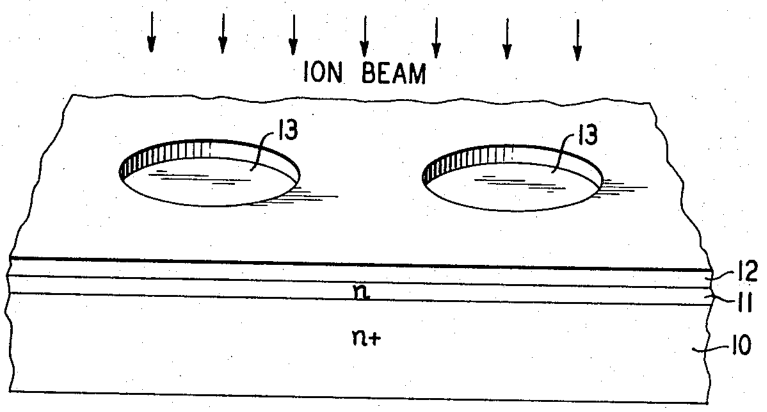
FIGS. 1A to 1C are schematic representations of sequential processing steps that may be used to form the shadow mask of the invention.

Referring now to FIG. 1A, there is shown an *n*+ silicon substrate 10 supporting an epitaxial silicon layer 11. The resistivity of the layer should be at least an order of magnitude greater than that of the substrate and preferably should have an absolute resistivity of greater than 1 ohm cm. This layer can be formed by any standard epitaxial method and should have a thickness, depending upon the resolution desired, of the order of 0.5 to 5 $\mu$.

The layer 11 is coated with a masking material which is in turn treated by standard photoresist techniques to form a masking layer 12 having the desired pattern indicated by exposed regions 13. For subsequent ion implantation, this mask can appropriately be one of many known masking materials such as 0.1 to 1.0$\mu$ of aluminum, gold or nickel. The masking layer 12 need not form part of the ultimate mask structure and in an alternative sense this masking function can in appropriate cases be served by a shadow mask similar to the kind being made. This is suggested in those cases where the mask is to be used for preferential ion beam exposure.

Figure 1B:
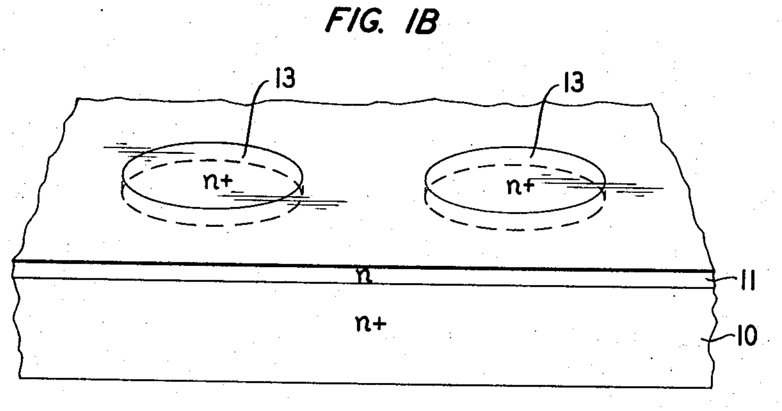

The structure of FIG. 1A is then exposed to an ion beam for implanting the regions 13 with an *n*+ impurity. The exposure should be sufficient to dope these regions down to or close to the substrate 10 to a concentration meeting the requirements previously established for the substrate material. The resulting structure is shown in FIG. 1B with the masking layer 12 removed. It will be seen that in alternative embodiments to be described below, this layer is advantageously retained at this stage in the processing.

The doped regions 13 can alternatively be formed by thermal diffusion of impurities through the exposed regions of the masking layer 12. The usefulness of this alternative will depend to some extent on the thickness of the layer 11. It should be pointed out that if the layer 11 is very thick then excessive lateral diffusion may occur near the surface before the subsurface regions receive the requisite doping. Thus for optimum resolution of the final shadow mask, it is preferred that the impurity regions be formed by ion implantation. Ion implantation techniques are capable of forming subsurface impurity regions with a minimum of lateral diffusion.

Figure 1C:
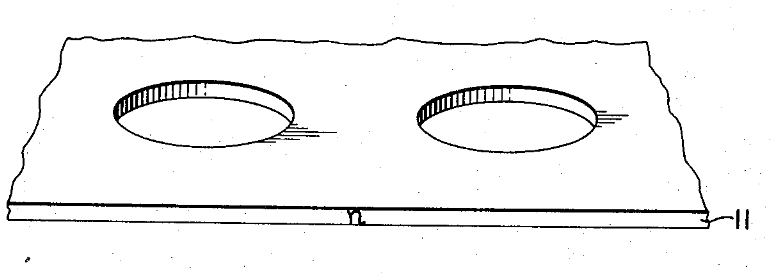

The composite structure, which now comprises a very thin n-silicon layer with *n*+ regions formed through its thickness in a desired pattern, is heated to a temperature in excess of 650° to activate the *n*+ regions and then exposed to the preferential etch treatment described in Dutch patent application 6,703,013. This treatment may for example involve electrolytically treating the structure as anode in a bath of 5 percent hydrofluoric acid at a temperature of 25° C. and a current density in the range of 40 to 100 mA/cm$^2$. This treatment gives an etch rate for the n+ material that is of the order of ten times the etch rate for the n-silicon that forms the ultimate mask. The electrolytic treatment is continued until the *n*+ material in the regions 13 and the substrate layer 10 are removed, leaving the final shadow mask as shown in FIG. 1C. It should be noted that even if the regions 13 do not extend completely through to the n+ substrate, the preferential etch will effectively remove them due to injection of holes through the unconverted region during electrolysis resulting in preferential removal.

In those cases where the final thickness of the n-layer 11 is very small, it will be advantageous to employ the preferential etch techniques described here for the formation of stiffening or rigid rib members. These members can conveniently be made integral with those regions of the shadow mask that will not participate in the masking function.

Figure 2A:
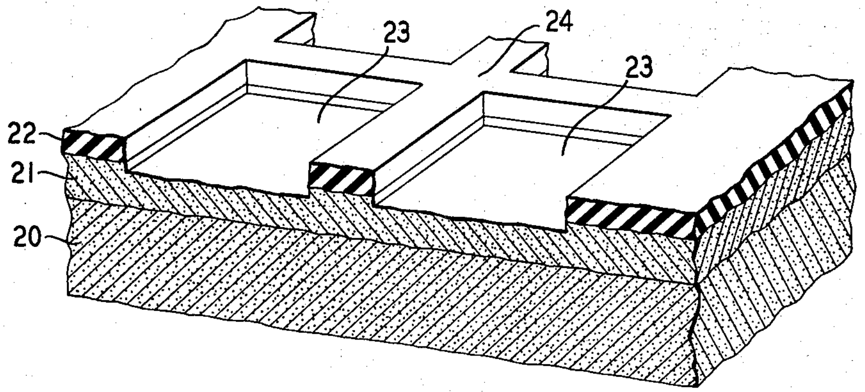
FIGS. 2A to 2D are schematic representations of alternative steps that provide a rigid structure.
Figure 2B:
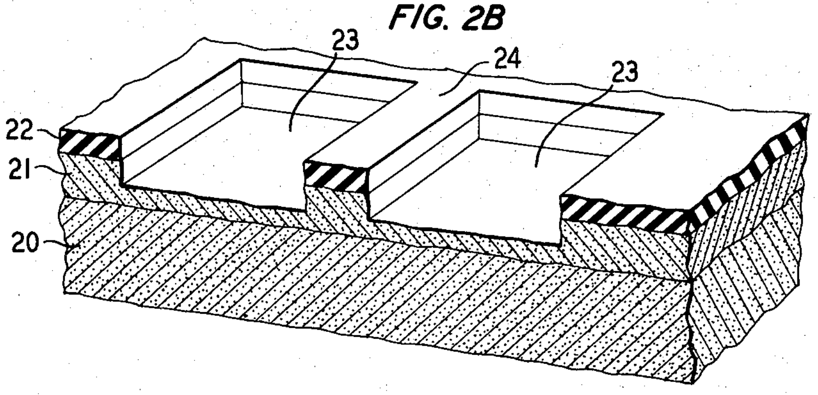

With reference to FIG. 2A, there is shown a composite structure similar to that of FIG. 1A except that the pattern of the resist layer 22 defines the ribs or stiffening structure, i.e., the grid 24. The reference numbers 20 and 21 correspond to reference numbers 10 and 11 of FIG. 1A. The structure of FIG. 2A is shown already exposed to one etch step that has removed a portion of the thickness of layer 21. This sequence of steps includes multiple etch steps that are interspersed with multiple doping operations for the reason that the layer 21 is typically quite thick so as to provide the thickness necessary for the stiffening grid 24. The masking layer 22 advantageously remains in place throughout these steps. FIG. 2B shows the wafer at a later stage of the process, after at least one further doping and preferential etch step. It will be seen that the substrate 20 is being thinned while the windows 23 become deeper. The ratio of the thickness of the stiffening ribs 24 to the thinned regions of the windows 23 is largely a matter of choice. It should exceed 2 to confer significant benefit and no advantage is seen in extending this ratio beyond 20 (approximately a 1 mil rib for a 1 $\mu$ thick mask section).

When the thickness ultimately desired for the window regions 23 is reached, the mask for the windows 22 is replaced by a mask 26 defining the detail desired for the shadow mask. It is desirable, from the standpoint of the effectiveness of this masking operation, that the windows 23 have substantial size, e.g., 50 to 500 $\mu$. In making many small (ultimately separate) integrated circuits on a single semiconductor chip it may be convenient for each circuit to occupy one window.

Figure 2C:
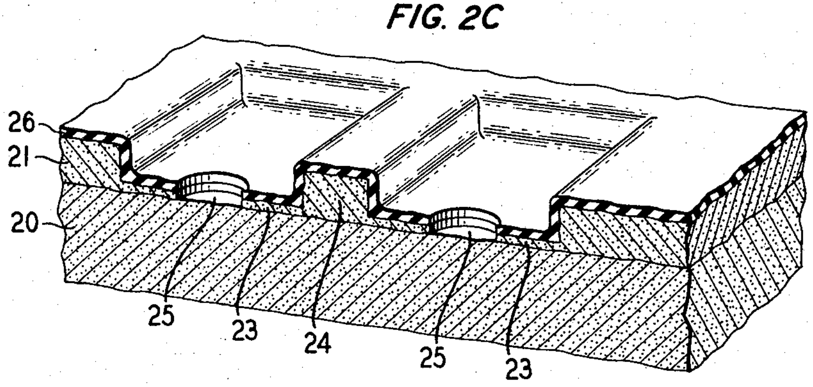
Figure 2D:
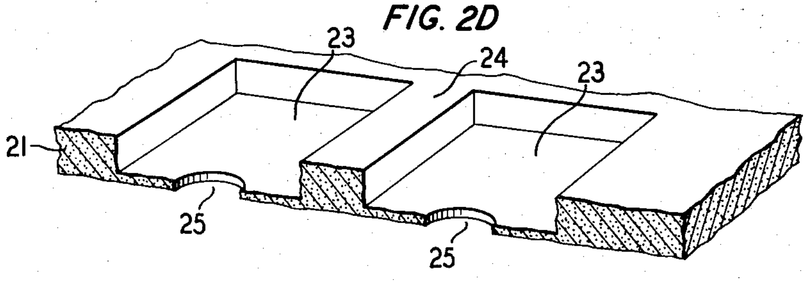

The masked structure of FIG. 2C is exposed as before to a procedure for the selective removal of the unmasked material that is represented in the Figure at 25. The selectively removed regions 25 are shown as single holes for simplicity but in practice might be highly complex. After the wafer is exposed to the selective removal of the *n*+ layer 20, which may occur simultaneously with or separately from the removal of the areas defined by 25, and the removal of the masking layer 26, the final shadow mask remains as shown in FIG. 2D. In some cases it may be desirable to retain layer 26 for greater integrity or more effective masking.

Figure 3A:
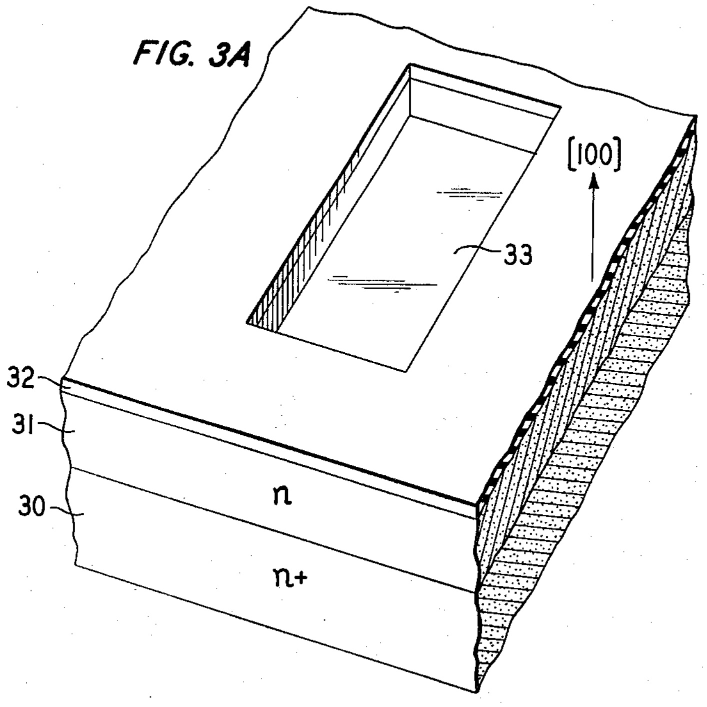
FIGS. 3A to 3C are schematic representations that show yet another alternative sequence of steps for further enhancing the resolution of the shadow mask.
Figure 3B:
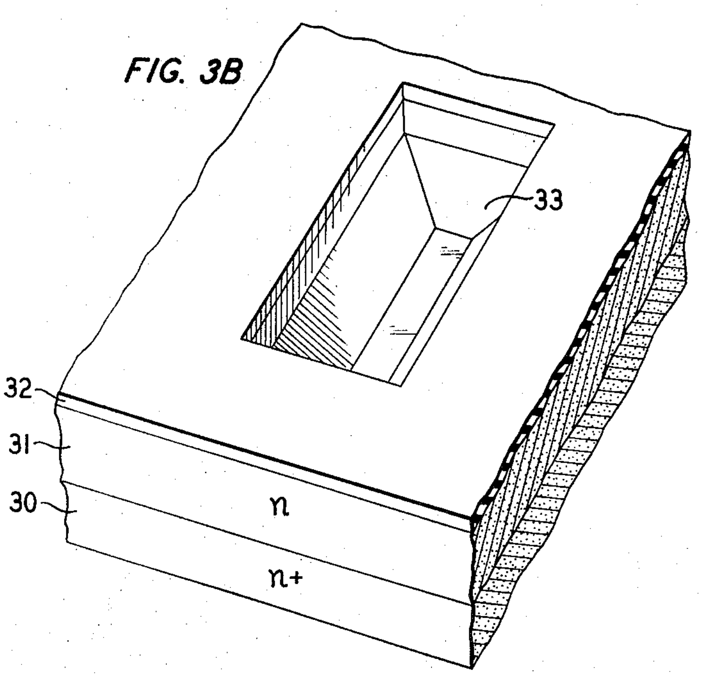
Figure 3C:
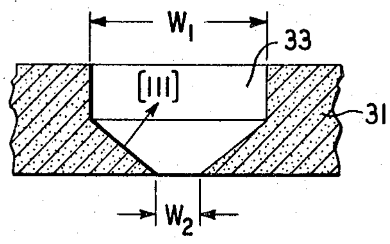

The resolution of the final shadow mask can be improved still further by resort to the expedient illustrated in FIGS. 3A, 3B, and 3C. In FIG. 3A the *n*+—silicon substrate is shown at 30 with the n-layer 31 covering the substrate as before. A masking layer 32 is applied to the surface of the n-layer in the configuration desired in the final shadow mask, but with different dimensions for a reason that will become apparent. The thickness of the layer 30 corresponds to the ultimate thickness of the shadow mask. A region 32 is selectively removed by, for example, the preferential etch technique described in connection with FIGS. 1 and 2. However, this selective removal step is terminated prior to complete penetration of the n-layer 30, i.e., the depth of the etched region 32 is less than the thickness of the n-layer. At this point the structure is exposed to an anisotropic crystallographic etch. If the substrate 30 is oriented with the {100} crystallographic plane being treated (this designation including orientations equivalent to [100] by symmetry), the etch will proceed preferentially along the {111} crystal planes and will produce an etched region such as that appearing in FIG. 3B. Removal of the temporary masking layer 32 and the preferential removal of the *n*+ support layer 31, as before, leaves the structure shown in FIG. 3C. It will now be evident that, with reference to FIG. 3C, the ultimate width of the etched region, designated $W_2$, is less than the original dimension, $W_1$, of the mask. Therefore, if the dimensions in the mask 32 are limited by the resolution capabilities of the photolithography, then this resolution can be improved by the combined preferential etch treatments just described. Since the {111} crystal planes are 45° to the normal, the width $W_2$ can theoretically be infinitely small as the depth of the crystallographic etch is made to approach one-half of the original dimension, $W_1$.

Anisotropic crystallographic etches for producing the result just described are known in the art. See for example, United States patent application Ser. No. 603,292, filed Dec. 20, 1966, by R. C. Kragness and H. A. Waggener (now abandoned). To the extent that other etch techniques are, or become available for other materials, this aspect of the invention will be applicable to those materials and to other crystal orientations as well.

This embodiment of the invention is intended for those high resolution applications which suggest an ultimate thickness for the shadow mask of the order of 50 microns or less and this, as well as the previous embodiments, is expected to be especially effective in conjunction with the technology known as "thin silicon" in which the thickness of the mask would normally be less than 10 $\mu$. For effective masking in the usual sense, the layer would not be thinner than 0.1$\mu$.

While the foregoing examples have been described in terms of the selective removal of low resistivity material, the invention is not so limited. The complementary situation and others involving p-n junctions may be treated in accordance with the preferential etch treatment described and claimed in United States patent application Ser. No. 885,605.

Various additional modifications and extensions of this invention will become apparent to those skilled in the art. All such variations and deviations which basically rely on the teachings through which this invention has advanced the art are properly considered within the spirit and scope of this invention.

What is claimed is:

1. In a process for selectively exposing portions of a semiconductor body to ion beam radiation through a preformed shadow mask, the invention characterized by directing the ion beam through the shadow mask, said shadow mask consisting of a thin sheet of silicon having a predominant thickness of less than 10 $\mu$ with the desired pattern of openings formed through its thickness.

2. The process of claim 1 in which the shadow mask includes reinforcing ribs formed in a grid-like pattern integral with the shadow mask and having a thickness at least twice the thickness of the shadow mask.

3. The process of claim 2 in which the spaces in the grid have a minimum width of at least 50$\mu$.

4. The process of claim 3 in which each grid space accommodates a separate microcircuit processing pattern.

* * * * *